United States Patent [19]
Ovaska

[11] Patent Number: 5,313,549
[45] Date of Patent: May 17, 1994

[54] PROCEDURE FOR FILTERING THE SPEED FEEDBACK SIGNAL

[75] Inventor: Seppo J. Ovaska, Hyvinkaa, Finland

[73] Assignee: Kone Elevator GmbH, Baar, Switzerland

[21] Appl. No.: 893,060

[22] Filed: Jun. 3, 1992

[30] Foreign Application Priority Data

Jun. 5, 1991 [FI]  Finland .................................. 912704

[51] Int. Cl.$^5$ ............................................ H02P 5/165
[52] U.S. Cl. ................................... 388/814; 318/799; 318/807; 388/801
[58] Field of Search ................................. 388/809–815, 388/901, 902, 908; 318/798–802, 739–740, 807–811

[56]  References Cited

U.S. PATENT DOCUMENTS

| | | | |
|---|---|---|---|
| 4,243,582 | 8/1993 | Yamauchi | 358/342 |
| 4,547,847 | 10/1985 | Olig et al. | 318/561 X |
| 4,804,894 | 2/1989 | Machida et al. | |
| 4,990,840 | 2/1989 | Migda | 318/571 |
| 5,008,543 | 4/1991 | Bertrand | 356/1 |
| 5,124,626 | 6/1992 | Thoen | 318/610 |

OTHER PUBLICATIONS

Ovaska, S. J. "Multistage digital prefiltering of noise tachometer signals", Sep. 1988, pp. 466–468.
Neuvo Y. and Heinonen P., "FIR-Median Hybrid Filters with Predictive FIR Substructures", Jun. 1988, pp. 892–899.
Oppenheim A. V., Schafer R. W., "Discrete-Time Signal Processing", 1989, pp. 290–317.
Putas I., Venetsampoulus A. N., "Nonlinear Digital Filters", 1990, pp. 63–65.

Primary Examiner—William M. Shoop, Jr.
Assistant Examiner—David Martin
Attorney, Agent, or Firm—Sughrue, Mion, Zinn, Macpeak and Seas

[57] ABSTRACT

A procedure is disclosed for filtering the speed feedback signal in an elevator motor drive which is provided with a speed controller and in which the speed of rotation of the motor is measured. The procedure of the invention involves sampling the speed feedback signal, producing a prediction of the next sample by a predicting procedure that filters the noise in the speed feedback signal, and forming an estimate of the latest sample by delaying the prediction by a time corresponding to one sample.

6 Claims, 7 Drawing Sheets

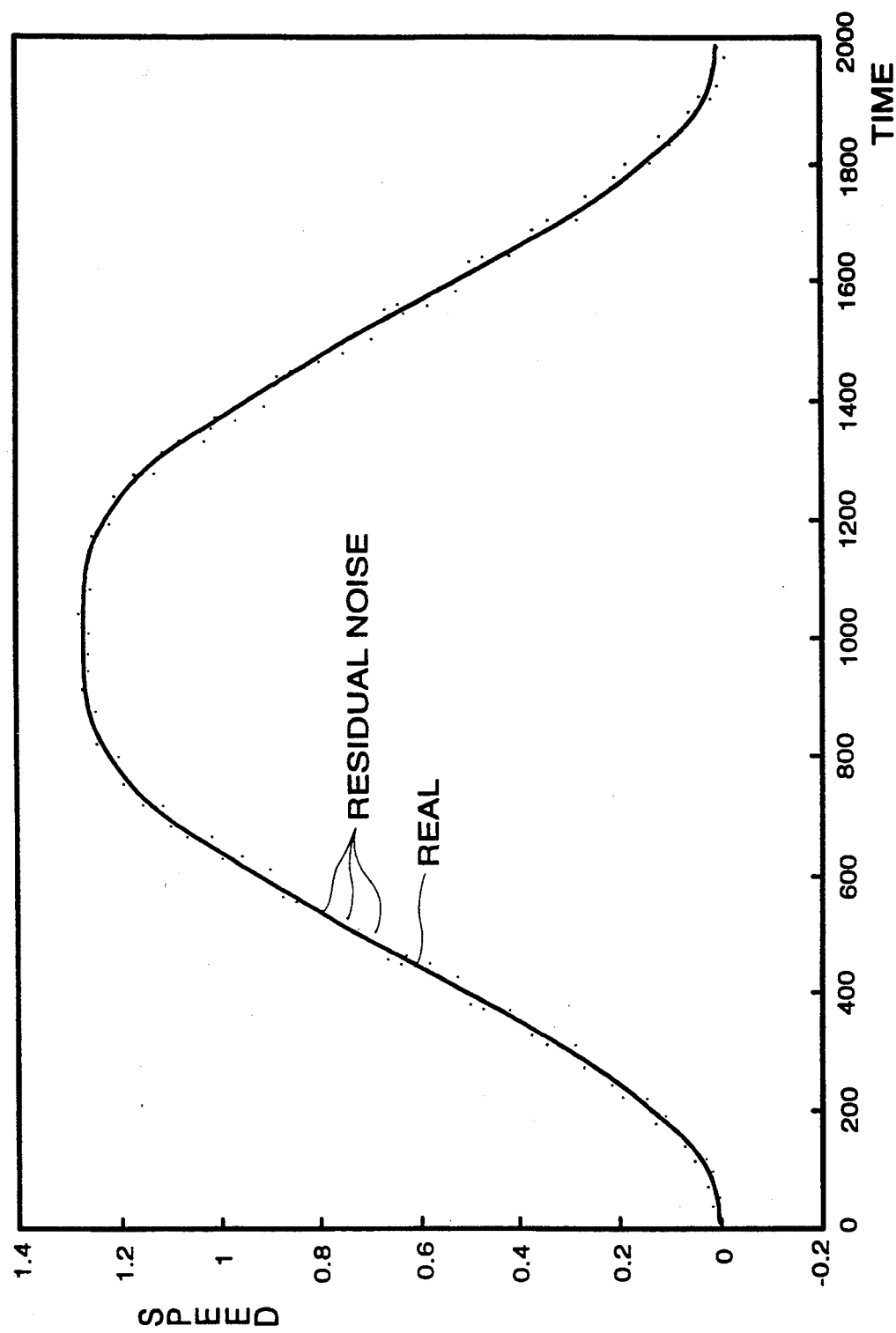

PROCEDURE FOR FILTERING THE SPEED FEEDBACK SIGNAL

FIELD OF THE INVENTION

The present invention relates to a procedure for filtering the speed feedback signal in an elevator motor drive provided with a speed controller and in which the speed of rotation of the motor is measured.

BACKGROUND TO THE INVENTION

To suppress the noise in the speed feedback signals in elevator drives, low-pass filters are currently used. However, these cause a delay in the processing of the primary signal and thus make the servo system more difficult to control. Also, non-linear median filters have been used for the filtering of a feedback signal measured by means of a tachometer generator, but they, too, produce an undesirable additional delay in the control loop. The noise appearing in tachometer signals is dealt with e.g. in an article by S.J. Ovaska, entitled "Multistage digital prefiltering of noise tachometer signals", IEEE Transactions on Instrumentation and Measurement, vol. 37, no. 3, September 1988, pp. 466–468.

SUMMARY OF THE INVENTION

An object of the present invention is to substantially eliminate the drawbacks of the previously known techniques. The procedure of the invention for filtering the speed feedback signal in an elevator motor drive provided with a speed controller is based on predicting and delaying samples obtained from the speed feedback signal.

According to the present invention, there is provided a procedure for filtering the speed feedback signal in an elevator motor drive which is provided with a speed controller and in which the speed of rotation of the motor is measured, the procedure comprising the steps of: sampling the speed feedback signal, producing a prediction of the next sample by a predicting procedure that filters the noise in the speed feedback signal, and forming an estimate of the latest sample by delaying the prediction by a time corresponding to one sample.

The procedure of the invention can be applied both to the suppression of the noise in speed feedback signals produced by conventional tachometer generators and to the reduction of the random error contained in speed signals obtained by calculating from the pulse duration of a pulse encoder. The procedure of the invention does not produce any additional delay in the control loop. Using this procedure improves the speed controller's ability to follow the reference and consequently enhances the travelling comfort offered by the elevator system.

BRIEF DESCRIPTION OF THE DRAWINGS

In the following, the invention is described in detail by the aid of an example by referring to the drawings attached, in which:

FIG. 8 is a graph showing a speed signal filtered by the procedure of the invention.

DETAILED DESCRIPTION OF A PREFERRED EMBODIMENT

Figure 1:
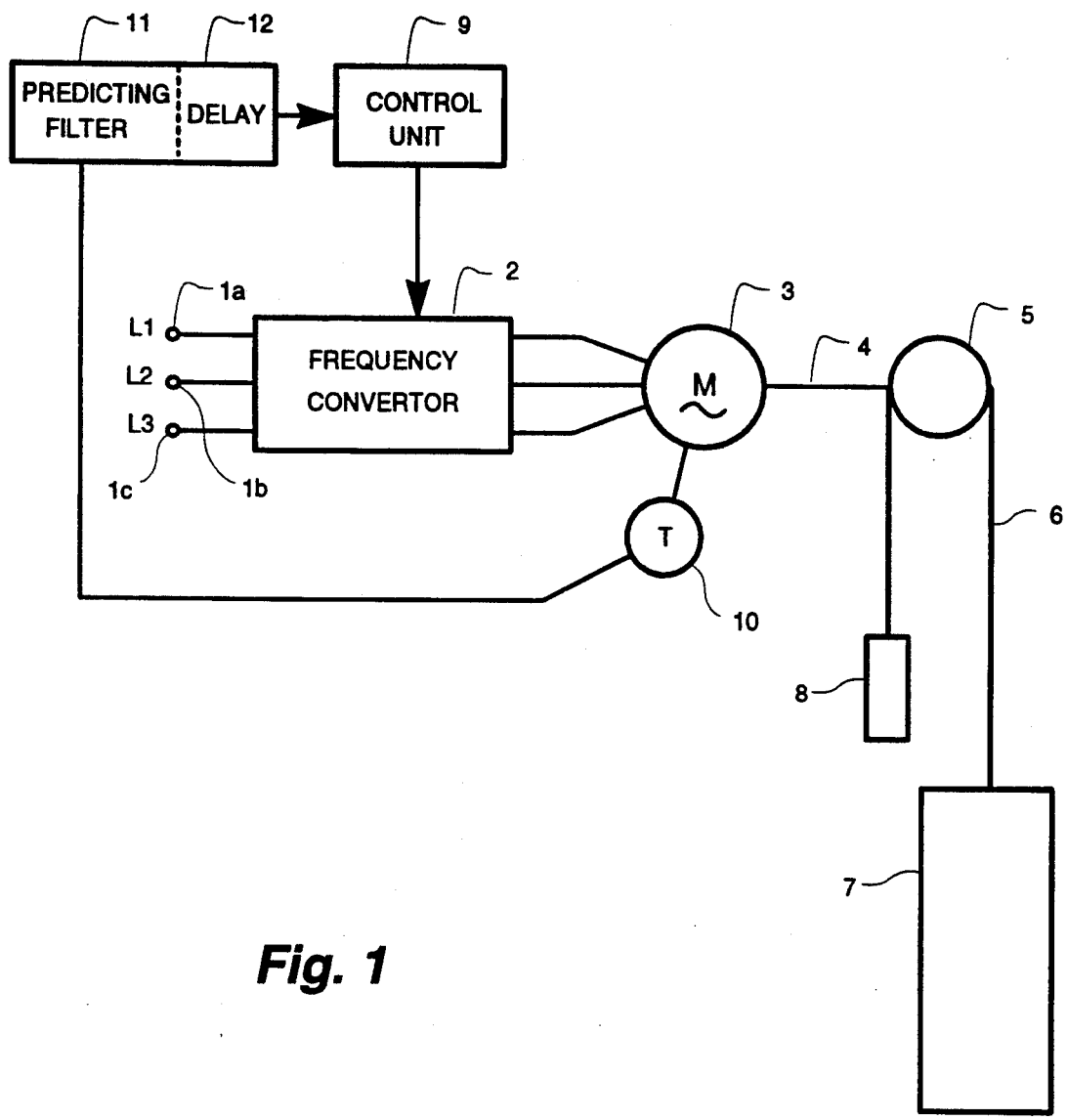
FIG. 1 is a schematic illustration of an elevator system together with its motor drive.

In the elevator system illustrated by FIG. 1, a frequency converter 2 connected to a three-phase network L1–L3 by means of connectors 1a–1c feeds a three-phase squirrel-cage motor (M) 3. The rotation of the motor is transmitted by a shaft 4 to a traction sheave 5 which, by means of hoisting ropes 6, moves the elevator car 7 and counterweight 8. The frequency converter 2 is controlled by a control unit 9 provided with a speed controller. The motor speed is measured by means of a tachometer generator 10. The speed feedback signal returned to the control unit 9 is filtered by means of a filter 11.

The filtering procedure of the invention is based on the use of predictors with a low-pass type frequency response. According to the invention, the predictor output is delayed by an amount corresponding to one sample, allowing an estimate for the latest real sample to be obtained.

Figure 2:
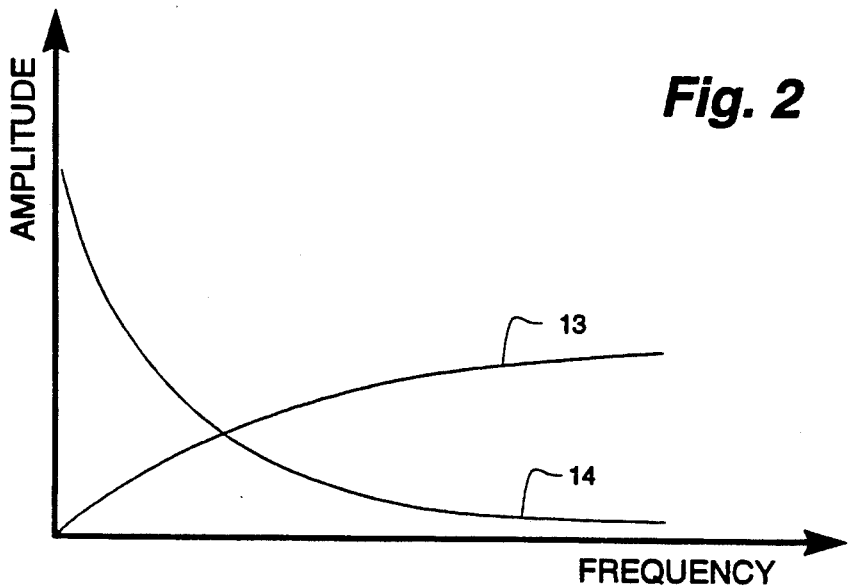
FIG. 2 is a graph showing a typical noise spectrum for a measured speed signal, and the spectrum of the output of a FIR predictor for implementing the procedure of the invention.

FIG. 2 represents a simplified diagram representing the typical frequency response 13 of the speed feedback signal of an elevator motor and the frequency response 14 of a predictor with a low-pass type frequency response. FIG. 2 shows that such a predictor effectively eliminates the noise in the speed signal by suppressing the high frequencies. A FIR (Finite Impulse Response) type predicting procedure suitable for use with the procedure of the invention is presented in an article entitles "FIR-median hybrid filters with predictive FIR substructures" by P. Heinonen and Y. Neuvo in IEEE Transactions on Acoustics, "Speech and Signal Processing", Vol. 36, no. 6, June 1988, pp. 892-899.

In the procedure of the invention, it is also possible to use other types of predictors besides the FIR type ones described in the article referred to above. For example, IIR (Infinite Impulse Response) type predictors can be used. FIR and IIR filters are described in the publication Oppenheim A.V., Schafer R.W.: Discrete-Time Signal Processing, Englewood Cliffs, NJ: Prentice-Hall, 1989, pp. 290–317.

An IIR filter (predictor) can be represented mathematically by means of the following differential equation with a constant factor:

$$x(k+1) = \sum_{i=0}^{N-1} n(i)x(k-i) + \sum_{j=0}^{M-1} m(j)x(k-j) \quad (1)$$

An IR filter (predictor) can be represented mathematically by means of the following differential equation with a constant factor:

$$x(k+1) = \sum_{i=0}^{N-1} n(i)x(k-i) \quad (2)$$

These known predictors are used in the procedure of the invention for the extrapolation of the future value of polynomes of a low degree, in practice not higher than 3rd degree, when a number of previous values are known. The speed reference curve of an elevator consists of this kid of 1st and 2nd degree curved parts.

The predictors used effectively reduce noise, of both normal and even distribution, that has been summed to the primary signal.

According to the invention, the input of the predicting filter 11 is supplied with measures/calculated speed samples at a constant sampling frequency, and its output provides a prediction of the next sample. Using a delay circuit 12 to delay the output by an amount corresponding to one sample makes it possible to obtain an estimate of the latest measured sample. The variance (power) of the noise comprised in this estimate is lower than the noise in the measured sample.

Figure 3:
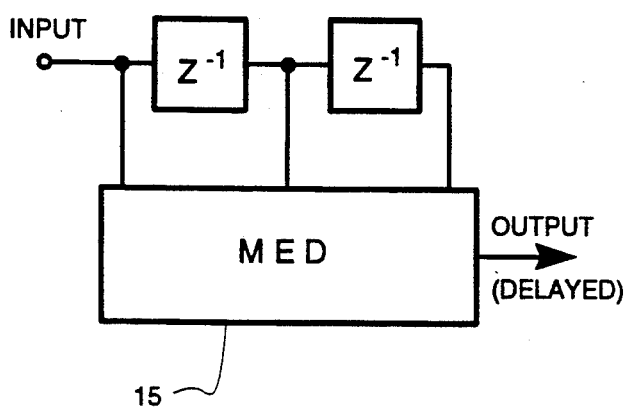
FIG. 3 is a block-diagram representing the median delay.
Figure 4:
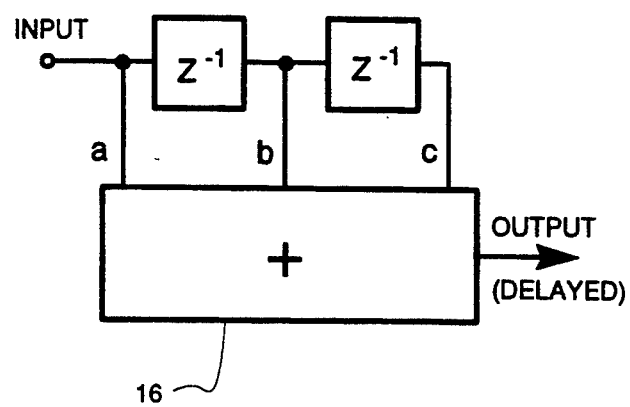
FIG. 4 is a block-diagram representing the FIR delay.

Instead of a delay circuit 12 it is possible to use a median filter 15 (ref. FIG. 3) of a length corresponding to three samples, for example, with a total delay equal to one sample. Median filters are descried in the reference publication I. Pitas, A.N. Venetsanopoulos: Nonlinear Digital Filters; Principles and Applications, Kluwer Academic Publishers, Boston, MA, 1990, pp. 63-65. The median filter can be placed either before the predictor or after it. In this way, additional reduction of especially fast noise transients is achieved. Also, it is possible to use a linear-phased FIR filter, for example, (ref. FIG. 4) of a length equal to three samples, i which the samples are given weight factors a, b and c symmetrical with respect to the centre of the filter. The weighted samples are then added together in a summing element 16. Using a FIR delay enables the filtering of e.g. mains noise, while the median delay can be used to filter noise like impulse peaks.

To visualize the action of the procedure of the invention, it was tested by performing a series of computer simulations based on a noise-free speed signal of a duration corresponding to 200 samples, with a sampling interval of 500 Hz.

Bipolar noise with a standard deviation of 0.02 and even distribution was added to the noise-free speed signal.

Figure 5:
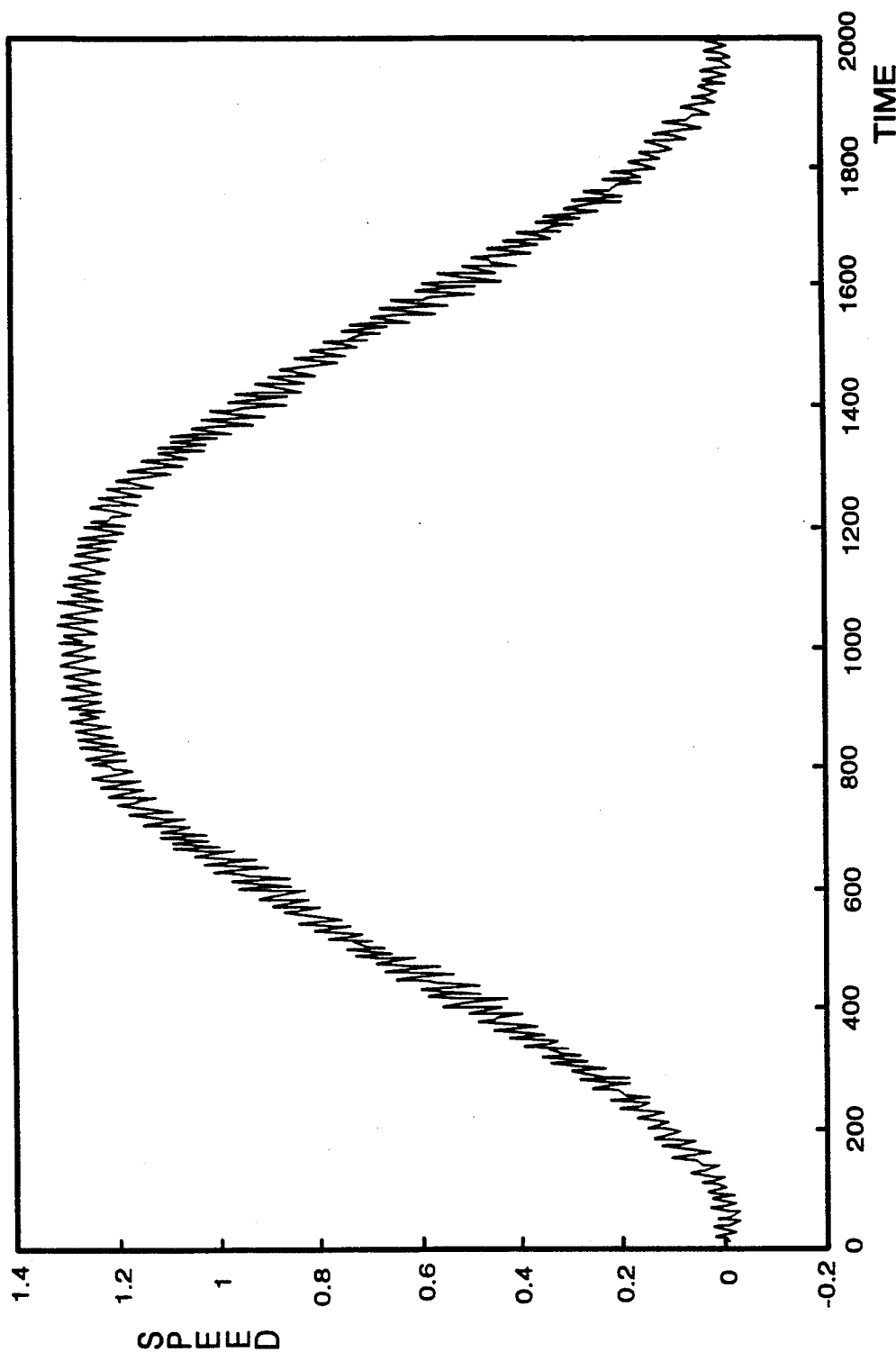
FIG. 5 is a graph showing a typical measured speed signal.
Figure 6:
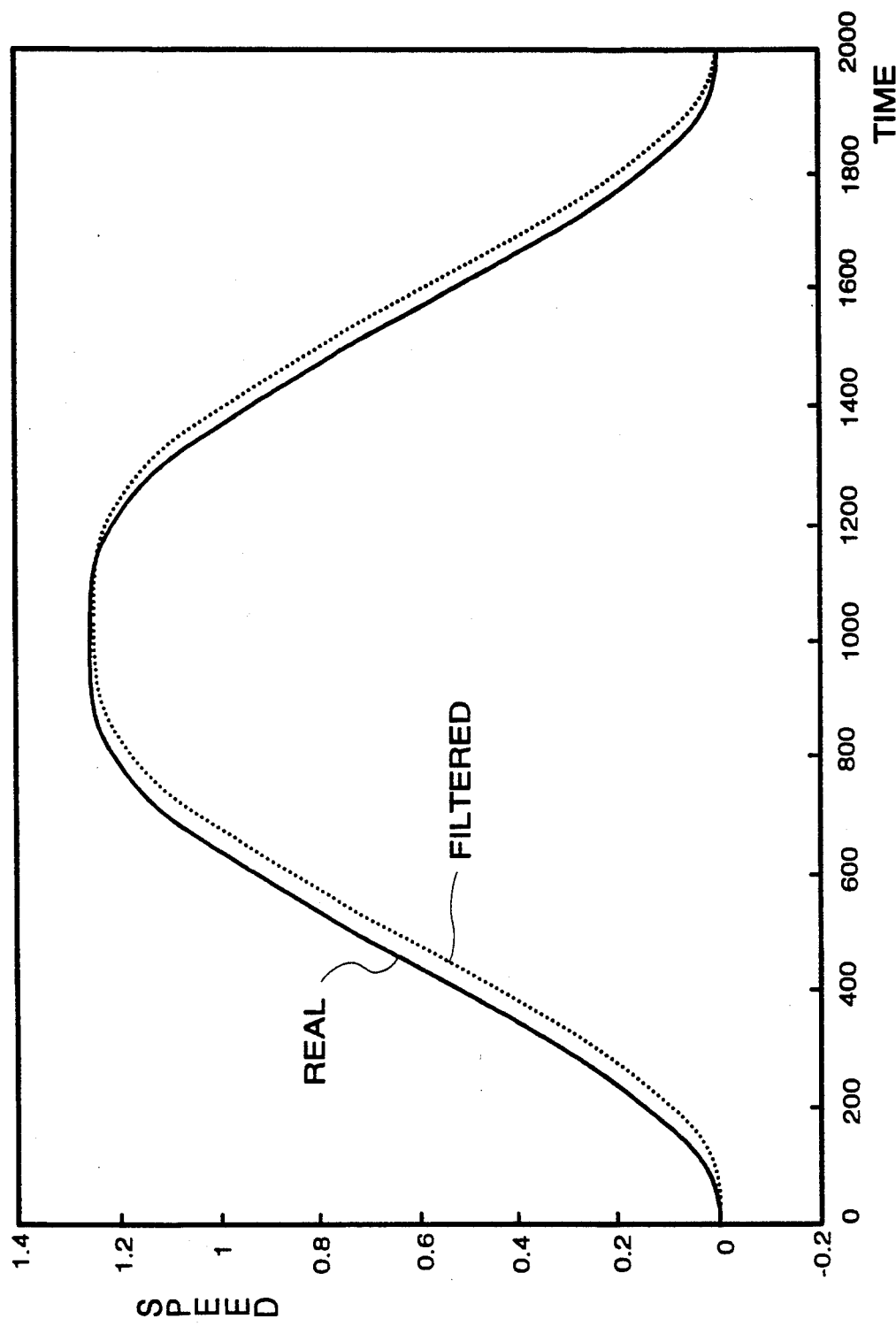
FIG. 6 is a graph showing a speed signal filtered by conventional techniques.

The noisy speed signal (FIG. 5, in which the horizontal axis represents time, the value 2000 corresponding to 4S) was first filtered with a known median filter (length 24 samples), which, in respect of noise suppression, is optimal for the filtering of noise with normal and even distribution. The result (ref. FIG. 6) was otherwise excellent but the filter output (dotted line) was delayed with respect to the real signal (continuous curve) (FIG. 6, horizontal axis as in FIG. 5). Similar results are also obtained when other types of conventional low-pass filters are used.

Figure 7A:
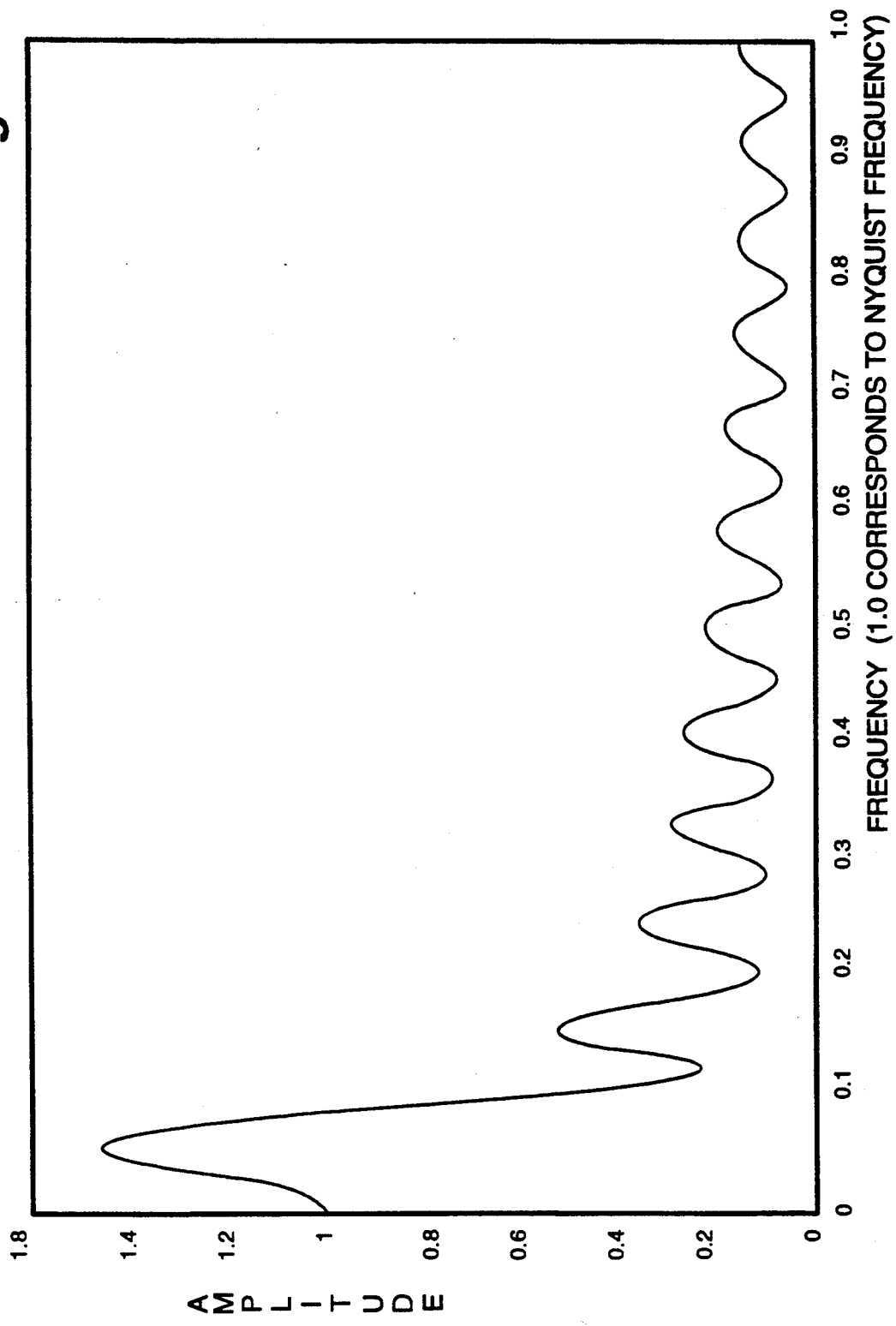
FIGS. 7a and 7b are graphs showing the frequency responses of a FIR predictor.
Figure 7B:
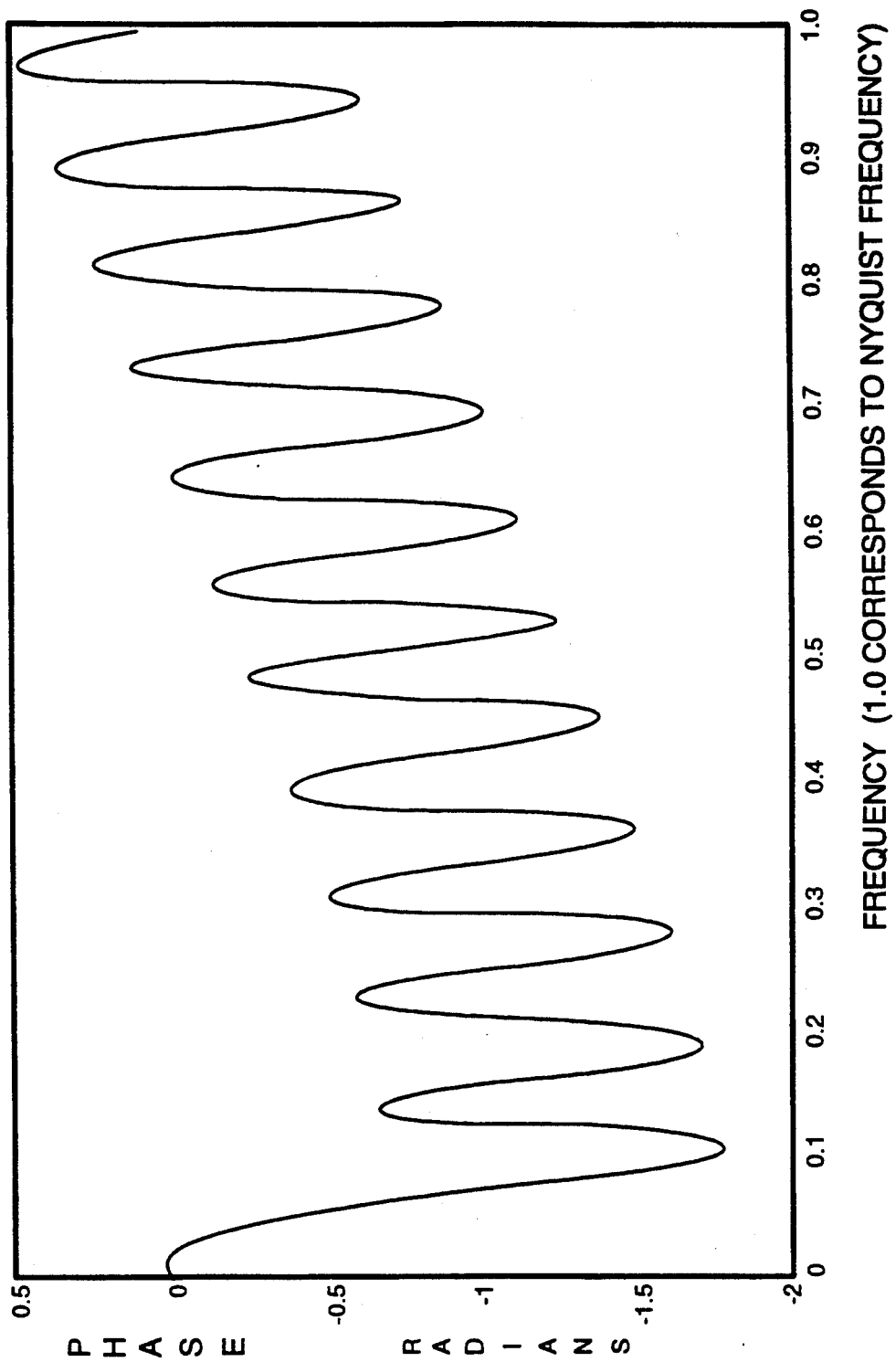

Next, the same noisy signal was filtered, according to the procedure of the invention, with the delayed FIR predictor (length 24 samples). The frequency responses for this predictor are shown in FIG. 7a (amplitude) and 7b (phase). The horizontal axis in FIG. 7a and 7b represents the frequency. The value 1 corresponds to the Nyquist frequency, which is half the sampling frequency being used. Referring to FIG. 8, it can be seen that, following the procedure of the invention, the noise level was not reduced quite as much as in the case of the median filter, but in this case the primary signal was not delayed. The coefficients of the predictor were calculated from equation (2) given in the aforesaid article by P. Heinonen and Y. Neuvo.

The above test was performed using predictors of various lengths (n) (the error power contained in the unfiltered signal has been normalized to the value 1) and the results analyzed according to the table below.

| N | input error power | median filter error power | predictor error power |
|---|---|---|---|
| 8 | 1.0 | 0.5085 | 0.6181 |
| 16 | 1.0 | 1.3837 | 0.2634 |
| 24 | 1.0 | 2.8611 | 0.1646 |
| 32 | 1.0 | 4.9042 | 0.1253 |
| 40 | 1.0 | 7.5069 | 0.1053 |

Using the method of the lowest sum of squares, numeric formulas for the output error power (including both the noise component and the delay) were calculated.

$$P_{out}(\text{median filter}) = 0.01461 N^{1.675}$$

Thus, the output error power for a conventional median filter is roughly proportional to the square of the length of the filter, i.e. the error power is a function that increases with the filter length.

$$P_{out}(\text{predicting filter}) = 6.008 N^{-1.114}$$

Thus the output error power for a predicting filter according to the invention is almost inversely proportional to the number of coefficients in the predicting filter, i.e. the error power is a function that decreases with the length of the filter.

It will be apparent to a person skilled in the art that different embodiments of the invention are not restricted to the examples described above, but that they may instead be varied within the scope of the following claims.

We claim:

1. A procedure for filtering the speed feedback signal in an elevator motor drive which is provided with a speed controller and in which the speed of rotation of the motor is measured, said procedure comprising the steps of:
    sampling the speed feedback signal,
    filtering the noise component of the sampled feedback signal by means of a predictive filtering procedure so as to produce a first filtered signal comprising a prediction of the value of the next sample, and
    filtering the first filtered signal by means of a delay-producing filtering procedure so as to produce a second filtered signal having an estimate of the latest sample value by delaying the predicted sample value by a time corresponding to one sample.

2. A procedure according to claim 1, wherein samples are taken at a sampling frequency that remains substantially constant.

3. A procedure according to claim 1, wherein the prediction is delayed by using a median filter whose length equals a predetermined number of samples and in which the total delay equals the duration of one sample.

4. A procedure according to claim 1, wherein the prediction is delayed by using a FIR (Finite Impulse Response) filter whose length equals a predetermined number of samples and in which the total delay equals the duration of one sample.

5. A procedure according to claim 1, wherein the prediction of the next sample is produced by means of a low-pass type predicting procedure extrapolating polynomes of third degree or less.

6. A procedure according to claim 5, wherein the prediction of the next sample is produced using any one of the group of FIR and IIR (infinite Impulse Response) type predicting procedures.

* * * * *